(12) United States Patent
Takeda et al.

(10) Patent No.: US 12,340,976 B2
(45) Date of Patent: Jun. 24, 2025

(54) PLASMA PROCESSING APPARATUS

(71) Applicant: Panasonic Intellectual Property Management Co., Ltd., Osaka (JP)

(72) Inventors: Naoaki Takeda, Osaka (JP); Shogo Okita, Hyogo (JP); Seiya Nagano, Osaka (JP); Toshihiro Wada, Osaka (JP); Takahiro Miyai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 209 days.

(21) Appl. No.: 18/336,139

(22) Filed: Jun. 16, 2023

(65) Prior Publication Data

US 2024/0014008 A1 Jan. 11, 2024

(30) Foreign Application Priority Data

Jul. 6, 2022 (JP) .................. 2022-109153

(51) Int. Cl.
*H01J 37/32* (2006.01)
(52) U.S. Cl.
CPC .............. *H01J 37/32183* (2013.01)
(58) Field of Classification Search
None
See application file for complete search history.

(56) References Cited

U.S. PATENT DOCUMENTS

| | | | | |
|---|---|---|---|---|
| 5,421,891 | A | * | 6/1995 | Campbell ......... H01J 37/32688 204/298.37 |
| 6,523,493 | B1 | * | 2/2003 | Brcka ................ H01J 37/3266 118/723 R |
| 9,275,837 | B2 | * | 3/2016 | Yamazawa ........ H01J 37/32091 |
| 9,515,633 | B1 | * | 12/2016 | Long .................. H01J 37/32119 |
| 9,745,663 | B2 | * | 8/2017 | Nguyen ................. C23C 14/28 |
| 9,779,953 | B2 | * | 10/2017 | Aubuchon ........ H01J 37/32669 |
| 9,960,011 | B2 | * | 5/2018 | Lee .................... H01J 37/32192 |
| 10,332,725 | B2 | * | 6/2019 | Sato .................. H01J 37/32174 |
| 10,354,838 | B1 | * | 7/2019 | Mopidevi ......... H01J 37/32183 |
| 10,381,197 | B2 | * | 8/2019 | Yamazawa ........ H01J 37/32082 |
| 12,165,845 | B2 | * | 12/2024 | Okita ................ H01J 37/32266 |
| 2010/0096088 | A1 | | 4/2010 | Okita et al. |

(Continued)

FOREIGN PATENT DOCUMENTS

JP 5467131 B2 4/2014

*Primary Examiner* — Srinivas Sathiraju
(74) *Attorney, Agent, or Firm* — MCDONALD HOPKINS LLC

(57) ABSTRACT

A disclosed plasma processing apparatus 10 includes: a chamber 11 having an opening 11a; a stage 12 disposed in the chamber 11, the stage for placing an object to be processed; a dielectric member 13 closing the opening 11a; and a plasma generation unit 16 disposed on the opposite side to the chamber 11 with reference to the dielectric member 13, and configured to, when applied with a high-frequency power, generate a plasma in the chamber 11. The plasma generation unit 16 has a first coil 17 including one or a plurality of first conductors 17a connected in parallel with each other, and a second coil 18 disposed so as to surround the first coil 17 and including a plurality of second conductors 18a connected in parallel with each other. The number of the second conductors 18a is greater than the number of the first conductors 17a.

4 Claims, 3 Drawing Sheets

(56) References Cited

U.S. PATENT DOCUMENTS

| | | | | |
|---|---|---|---|---|
| 2011/0024044 | A1* | 2/2011 | Nagakubo | H01J 37/3244 |
| | | | | 156/345.33 |
| 2012/0160808 | A1* | 6/2012 | Kikuchi | H01L 21/6831 |
| | | | | 156/345.52 |
| 2014/0144584 | A1* | 5/2014 | Koo | H01J 37/3211 |
| | | | | 156/345.48 |
| 2014/0312766 | A1* | 10/2014 | Carducci | H01J 37/321 |
| | | | | 315/34 |
| 2016/0293382 | A1* | 10/2016 | Sato | H01J 37/32174 |
| 2017/0236693 | A1* | 8/2017 | Kobayashi | H01J 37/32082 |
| | | | | 156/345.33 |
| 2017/0330736 | A1* | 11/2017 | De Bosscher | H01J 37/347 |
| 2017/0358427 | A1* | 12/2017 | Koo | H01J 37/32091 |
| 2018/0240697 | A1* | 8/2018 | Okita | H01J 37/32816 |
| 2019/0131115 | A1* | 5/2019 | Gu | H01L 21/3065 |
| 2019/0148118 | A1* | 5/2019 | Zhang | H01L 21/67109 |
| | | | | 156/345.26 |
| 2019/0164729 | A1* | 5/2019 | Mopidevi | H01J 37/32174 |
| 2019/0189396 | A1* | 6/2019 | Iwase | C23C 16/507 |
| 2021/0057185 | A1* | 2/2021 | Koo | H01J 37/321 |
| 2021/0327689 | A1* | 10/2021 | Long | H01L 21/67069 |
| 2022/0392751 | A1* | 12/2022 | Hill | H05H 1/4652 |
| 2023/0170186 | A1* | 6/2023 | Okita | H01J 37/3211 |
| | | | | 315/111.21 |
| 2024/0014009 | A1* | 1/2024 | Takeda | H01J 37/321 |
| 2024/0272120 | A1* | 8/2024 | Usui | H05H 1/24 |
| 2024/0339296 | A1* | 10/2024 | Zhao | H05H 1/46 |
| 2025/0014877 | A1* | 1/2025 | Nagai | H01J 37/32449 |
| 2025/0022682 | A1* | 1/2025 | Okita | H01J 37/3211 |

* cited by examiner

PLASMA PROCESSING APPARATUS

CROSS REFERENCE TO RELATED APPLICATION

The present application is based on and claims priority under 35 U.S.C. § 119 with respect to the Japanese Patent Application No. 2022-109153 filed on Jul. 6, 2022, of which entire content is incorporated herein by reference into the present application.

TECHNICAL FIELD

The present disclosure relates to a plasma processing apparatus.

BACKGROUND OF THE INVENTION

Conventionally, a plasma processing apparatus that performs plasma processing on an object to be processed has been known as disclosed in Patent Literature 1 (JP5467131B). The plasma processing apparatus of Patent Literature 1 includes a chamber, a stage which is disposed in the chamber and on which an object to be processed is placed, and a plasma generation unit configured to, when applied with a high-frequency power, generate a plasma in the chamber. The plasma generation unit has a first coil, and a second coil disposed so as to surround the first coil. In this plasma processing apparatus, by applying a high-frequency power to the plasma generation unit, while supplying a source gas into the chamber, a plasma for plasma-processing the object to be processed is generated in the chamber.

However, when the plasma generation unit has a second coil disposed so as to surround the first coil, due to a longer length of the second coil than that of the first coil, the impedance of the second coil tends to be higher than that of the first coil. In such a case, for example, the configuration of a distributing circuit for distributing the high-frequency power appropriately between the first coil and the second coil tends to be complicated. Under such circumstances, one object of the present disclosure is to reduce the difference in impedance between a plurality of coils.

SUMMARY OF THE INVENTION

One aspect of the present disclosure relates to a plasma processing apparatus. The plasma processing apparatus includes: a chamber having an opening; a stage disposed in the chamber, the stage for placing an object to be processed; a dielectric member closing the opening; and a plasma generation unit disposed on an opposite side to the chamber with reference to the dielectric member, and configured to, when applied with a high-frequency power, generate a plasma in the chamber, wherein the plasma generation unit has a first coil including one or a plurality of first conductors connected in parallel with each other, and a second coil disposed so as to surround the first coil and including a plurality of second conductors connected in parallel with each other, and the number of the second conductors included in the second coil is greater than the number of the first conductors included in the first coil.

According to the present disclosure, it is possible to reduce the difference in impedance between a plurality of coils.

DETAILED DESCRIPTION OF THE INVENTION

Figure 1:
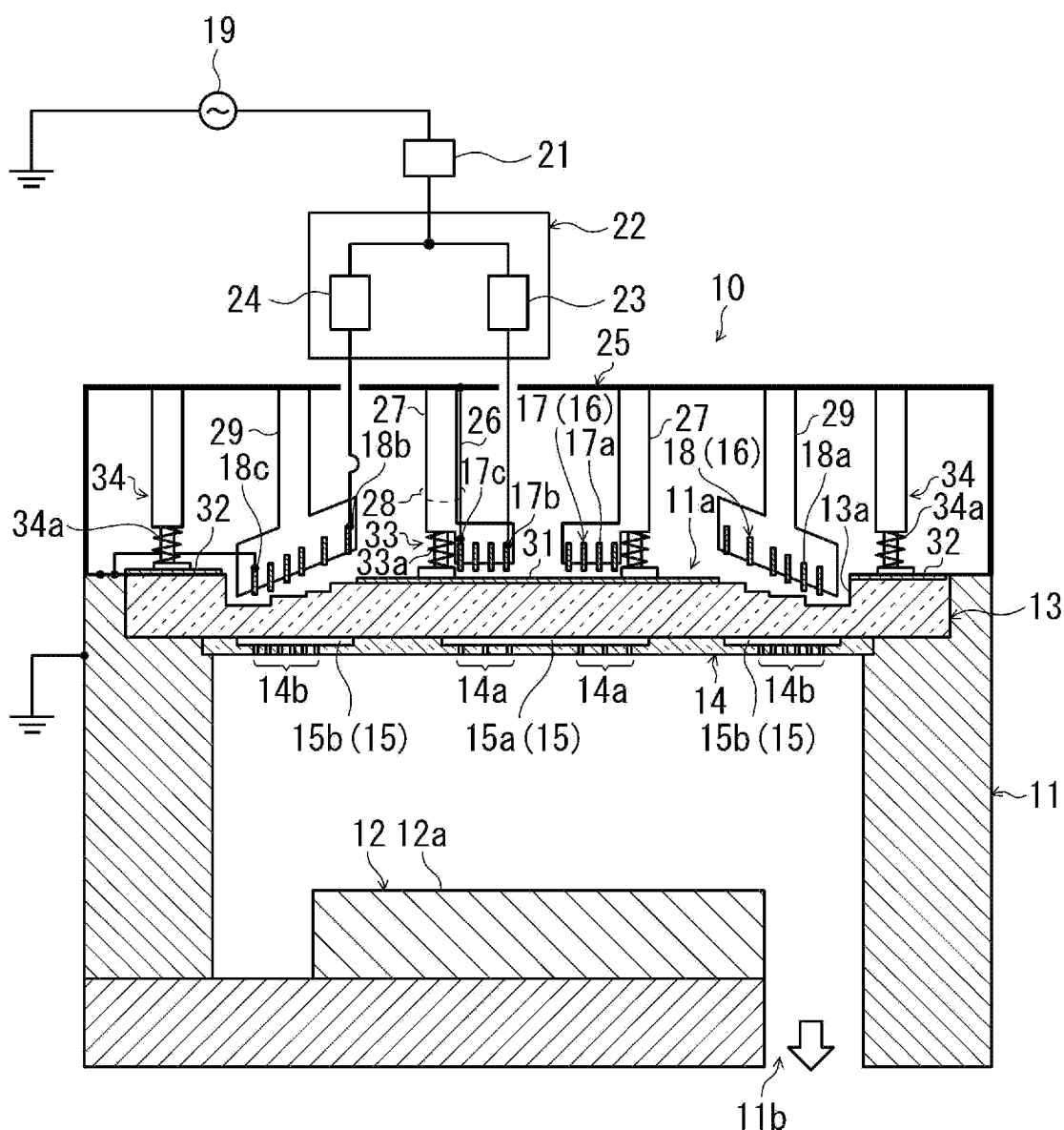
FIG. 1 is a schematic cross-sectional view of one example of a plasma processing apparatus according to the present disclosure.

Embodiments of a plasma processing apparatus according to the present disclosure will be described below by way of examples. It is to be noted, however, that the present disclosure is not limited to the examples described below. In the description below, specific numerical values and materials are exemplified in some cases, but other numerical values and materials may be applied as long as the effects of the present disclosure can be achieved.

(Plasma Processing Apparatus)

A plasma processing apparatus according to the present disclosure is for performing plasma processing on an object to be processed. The plasma processing apparatus may be, for example, a plasma etching apparatus, a plasma dicer, a plasma ashing apparatus, or a plasma CVD apparatus. The plasma processing apparatus includes a chamber, a stage, a dielectric member, and a plasma generation unit.

The chamber has an opening. The chamber may be formed in a hollow cylinder shape. The chamber may have an opening at the top. The opening may be open upward.

The stage is disposed in the chamber, and an object to be processed is placed thereon. The stage may have a horizontal placement surface for placing the object to be processed. The stage may have a flow channel for flowing a coolant for cooling the object to be processed during plasma processing. The stage may have an electrostatic chuck system for chucking the object to be processed. The stage may have a lower electrode to be applied with a high-frequency power. The object to be processed may be, for example, a semiconductor substrate to be singulated by plasma etching. The semiconductor substrate includes a plurality of element regions and dicing regions defining the element regions. The element regions include, for example, a semiconductor layer and a wiring layer. By etching the dicing regions, element chips having a semiconductor layer and a wiring layer can be obtained. The object to be processed may be supported on a carrier, and in this state, may be placed on the stage. The carrier may be, for example, a resin sheet with its outer peripheral portion held by a frame.

The dielectric member closes the opening of the chamber. The dielectric member may be formed in a plate shape having a horizontally extending region. The dielectric member may be constituted of, for example, ceramics, such as quartz, alumina, and aluminum nitride. The dielectric member may be mainly constituted of quartz.

The plasma generation unit is disposed on the opposite side to the chamber with reference to the dielectric member, and, when applied with a high-frequency power, generates a plasma in the chamber. The plasma generation unit may be provided above the dielectric member.

The plasma generation unit has a first coil and a second coil. The first coil includes one or a plurality of first conductors connected in parallel with each other. The second coil is disposed so as to surround the first coil. The second coil includes a plurality of second conductors connected in parallel with each other. The number of the second conductors included in the second coil is greater than the number of the first conductors included in the first coil.

Here, that "the second coil is disposed so as to surround the first coil" means that, when viewed from the axial directions of both coils (e.g., the vertical direction), at least the outermost peripheral portion of the second coil is positioned more circumferentially outward than the outermost peripheral portion of the first coil. On this precondition, it is desirable that the second coil desirably has a ring shape (doughnut shape) when viewed from the axial directions of both coils, and the outermost peripheral portion of the first coil is positioned inside the innermost peripheral portion of the second coil. The coil is an element including one or more conductors formed in a vortex or spiral shape, and when including a plurality of conductors, it refers to an element designed such that currents of the same phase flow through the plurality of conductors.

The second conductors included in the second coil have a larger maximum diameter than the first conductors included in the first coil. Therefore, the impedance of one second conductor is greater than the impedance of one first conductor. On the other hand, the number of the second conductors included in the second coil is greater than the number of the first conductors included in the first coil, and the plurality of second conductors are connected in parallel with each other. Therefore, the impedance of the second coil (i.e., the combined impedance of the plurality of second conductors) can be reduced to be closer to the impedance of the first coil. Moreover, when the second coil has a ring shape (doughnut shape), it is easy to reduce the impedance of one second conductor to be closer to the impedance of one first conductor. Here, the maximum diameter of the second conductors may be, for example, 2.5 times or more and 4 times or less as large as the maximum diameter of the first conductors. When the second coil has a ring shape (doughnut shape), the inner diameter of the second conductors may be, for example, 1.3 times or more and 3 times or less as large as the maximum diameter of the first conductors. The number of the second conductors included in the second coil may be, for example, 1.1 times or more and 5 times or less as great as the number of the first conductors included in the first coil.

As described above, according to the present disclosure, by reducing the impedance of the second coil to be closer to the impedance of the first coil, the difference in impedance between the two coils can be reduced. For example, according to the present disclosure, the impedance of the second coil can be made 0.8 times or more and 2 times or less as high as the impedance of the first coil.

The plasma processing apparatus may further include a high-frequency power source configured to supply a high-frequency power to the plasma generation unit, a matcher connected to the high-frequency power source, and a distributor connected between the matcher and the plasma generation unit. The distributor may have a first distributing circuit configured to distribute part of the high-frequency power to the first coil, and a second distributing circuit configured to distribute part of the high-frequency power to the second coil. The first distributing circuit and the second distributing circuit may be connected in parallel with each other. Only one high-frequency power source for supplying a high-frequency power may be provided in the plasma processing apparatus. According to this configuration, since the difference in impedance between the first coil and the second coil is small, it is possible to simply configure the first and second distributing circuits for distributing the high-frequency power appropriately between the two coils. This is particularly advantageous when only one high-frequency power source for supplying a high-frequency power to the plasma generation unit is provided in the plasma processing apparatus.

The first distributing circuit may have a first variable capacitor and an inductor connected in parallel with each other. The second distributing circuit may comprise only a second variable capacitor. In this way, according to the configuration of the present disclosure, a desired power control can be realized with a very simple distributing circuit configuration.

The first distributing circuit may further have a capacitor connected in series with the first variable capacitor and the inductor. The capacitor may be constituted of a fixed capacitor. The capacitor may be disposed between the first variable capacitor and the inductor, and the plasma generation unit.

The plasma generation unit may further include a third coil disposed so as to surround the second coil and including a plurality of third conductors connected in parallel with each other. The number of the third conductors included in the third coil may be greater than the number of the second conductors included in the second coil.

The plasma processing apparatus may further include a plurality of high-frequency power sources configured to supply a high-frequency power to the plasma generation unit. The plurality of high-frequency power sources may be configured such that each of them supplies a high-frequency power to one coil. For example, the plasma processing apparatus may include a first high-frequency power source for supplying a high-frequency power to the first coil, and a second high-frequency power source for supplying a high-frequency power to the second coil.

In the following, an example of the plasma processing apparatus according to the present disclosure will be specifically described with reference to the drawings. The components as described above can be applied to the components of the below-described examples of the plasma processing apparatus. The components of the below-described examples of the plasma processing apparatus can be modified based on the description above. The matters as described below may be applied to the above embodiments. Of the components of the below-described examples of the plasma processing apparatus, the components which are not essential to the plasma processing apparatus according to the present disclosure may be omitted. The figures below are schematic and not intended to accurately reflect the shape and the number of the actual members.

Figure 2:
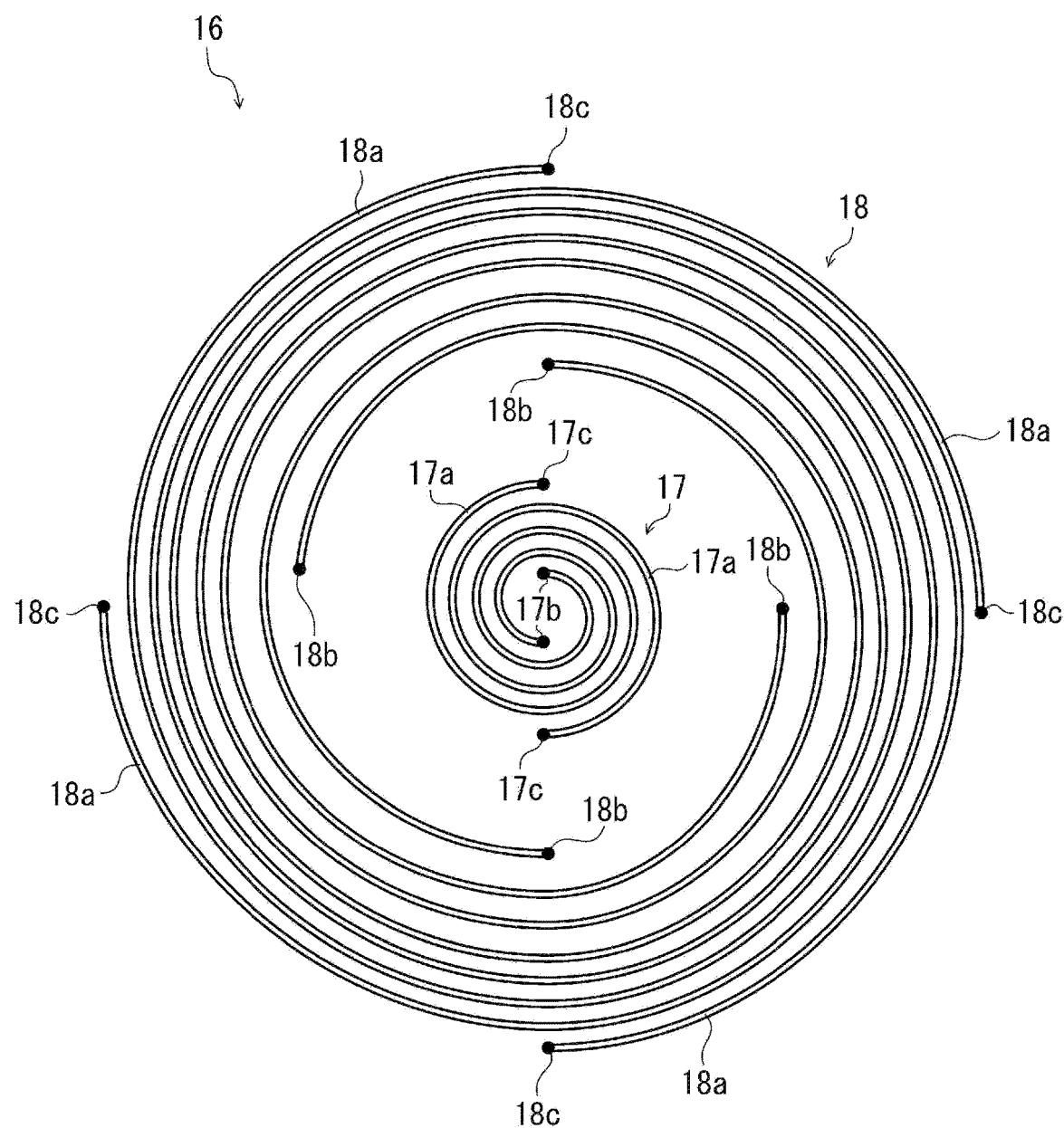
FIG. 2 is a schematic plan view of a plasma generation unit.
Figure 3:
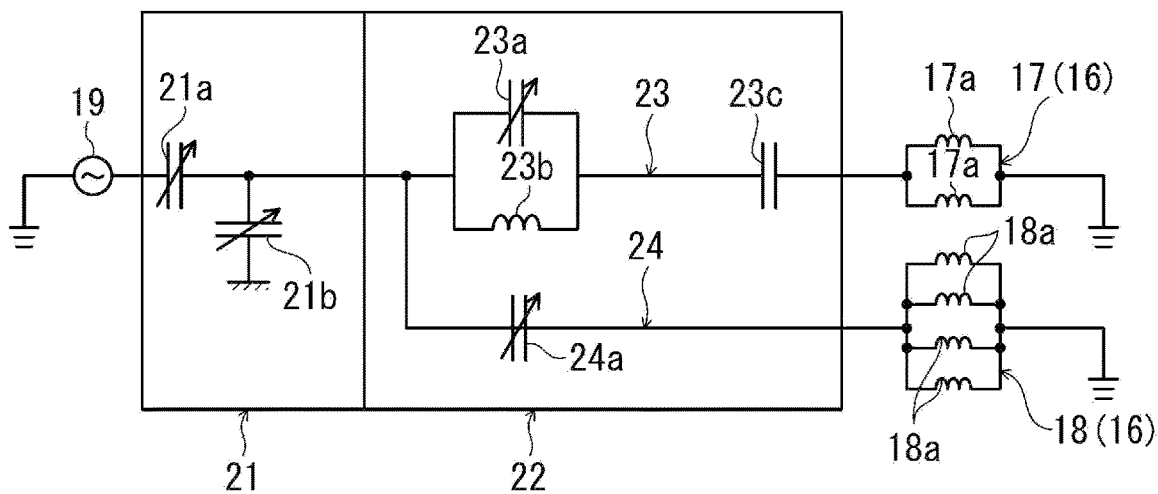
FIG. 3 is a schematic circuit diagram of a configuration from a high-frequency power source to the plasma generation unit.

A plasma processing apparatus 10 of the present embodiment is an apparatus for plasma-processing an object to be processed (e.g., a semiconductor substrate). The plasma processing apparatus 10 of the present embodiment is a plasma dicer, but is not limited thereto. As illustrated in FIGS. 1 to 3, the plasma processing apparatus 10 includes a chamber 11, a stage 12, a dielectric member 13, a cover 14, a gas introduction path 15, a plasma generation unit 16, a metal cover 25, a first support post 27, a second support post 29, a first heater 31, a second heater 32, a first pressing part 33, a second pressing part 34, a high-frequency power source 19, a matcher 21, and a distributor 22.

The chamber 11 has an opening 11a at the top. The chamber 11 is formed in a hollow cylindrical shape, but is not limited thereto. The opening 11a is open upward. The chamber 11 is disposed circumferentially outward from the stage 12, and has an exhaust port 11b for exhausting the source gas used for plasma processing. An exhaust device (not shown) is connected to the exhaust port 11b. The chamber 11 is constituted of a conductive member (e.g., metal). The chamber 11 is grounded.

The stage 12 is disposed within the chamber 11, and an object to be processed is placed thereon. The stage 12 has a horizontal placement surface 12a for placing the object to be processed. The stage 12 has a flow channel (not shown) for flowing a coolant for cooling the object to be processed during plasma processing. The stage 12 has an electrostatic chuck system (not shown) for chucking the object to be processed. The stage 12 has a lower electrode (not shown) to be applied with a high-frequency power.

The dielectric member 13 closes the opening 11a of the chamber 11. The dielectric member 13 is formed in a plate shape having a horizontally extending region. The dielectric member 13 is constituted of quartz, but is not limited thereto.

The cover 14 is installed so as to cover the dielectric member 13 inside the chamber 11. The cover 14 covers the lower surface of the dielectric member 13. The cover 14 includes a plurality of first gas holes 14a formed at positions overlapping a central region of the dielectric member 13, a plurality of second gas holes 14b formed at positions overlapping a peripheral region of the dielectric member 13. The first gas holes 14a and the second gas holes 14b each pierce the cover 14 in the thickness direction (the vertical direction in FIG. 1). The first gas holes 14a and the second gas holes 14b are communicated with the space in the chamber 11 where the stage 12 is provided. The plurality of the first gas holes 14a are provided at intervals in the radial direction and in the circumferential direction. The plurality of the second gas holes 14b are provided at intervals in the radial direction and in the circumferential direction. The cover 14 is constituted of aluminum nitride, but is not limited thereto.

The gas introduction path 15 is formed between the dielectric member 13 and the cover 14, and a source gas is introduced therethrough. The gas introduction path 15 has a first gas introduction path 15a communicated with the first gas holes 14a, and a second gas introduction path 15b communicated with the second gas holes 14b. The first gas introduction path 15a and the second gas introduction path 15b are each constituted of a groove formed in the cover 14. The first gas introduction path 15a and the second gas introduction path 15b are separated from each other. The first gas introduction path 15a and the second gas introduction path 15b are each communicated with outside the chamber 11. The first gas introduction path 15a and the second gas introduction path 15b are each connected with a gas source (not shown).

The plasma generation unit 16 has a first coil 17 and a second coil 18. The first coil 17 includes a plurality of (in this example, two) first conductors 17a connected in parallel with each other. The second coil 18 is disposed so as to surround the first coil 17. The second coil 18 includes a plurality of (in this example, four) second conductors 18a connected in parallel with each other. The impedance of one second conductor 18a is higher than the impedance of one first conductor 17a. The number of the second conductors 18a included in the second coil 18 is greater than the number of the first conductors 17a included in the first coil 17. As a result, the difference in impedance between the first coil 17 and the second coil 18 is reduced, which makes it easy to control the ratio between the power supplied to the first coil 17 and the power supplied to the second coil 18.

In the first coil 17, the plurality of first conductors 17a are displaced from each other in the circumferential direction by an angle obtained by dividing 360° by a first branch number. Here, the first branch number means the number of the first conductors 17a. For example, when the first coil 17 includes two first conductors 17a (when the first branch number is two), in the first coil 17, the two first conductors 17a are displaced from each other by 180° in the circumferential direction. In the second coil 18, the plurality of second conductors 18a are displaced from each other in the circumferential direction by an angle obtained by dividing 360° by a second branch number. Here, the second branch number means the number of the second conductors 18a. For example, when the second coil 18 includes four second conductors 18a (when the second branch number is four), in the second coil 18, the four second conductors 18a are displaced from each other by 90° in the circumferential direction. Such arrangement of the first conductors 17a and the second conductors 18a can reduce the variations in plasma density in the circumferential direction. The respective first conductors 17a and the respective second conductors 18a are spaced apart from each other in the radial direction.

One ends (first ends 17b) of the first conductors 17a constituting the first coil 17 are each connected to the high-frequency power source 19 via the distributor 22 and the matcher 21. The other ends (second ends 17c) of the first conductors 17a constituting the first coil 17 are each grounded via the chamber 11 which is electrically conductive. One ends (third ends 18b) of the second conductors 18a constituting the second coil 18 are each connected to the high-frequency power source 19 via the distributor 22 and the matcher 21. The other ends (fourth ends 18c) of the second conductors 18a constituting the second coil 18 are each grounded via the chamber 11 which is electrically conductive.

The metal cover 25 covers the first coil 17 and the second coil 18. The metal cover 25 is disposed on the upper side of the chamber 11 and electrically connected to the chamber 11. The metal cover 25 is formed in a cylindrical shape with a closed upper end, but is not limited thereto. The metal cover 25 may be constituted of, for example, aluminum.

The first support post 27 is installed above the central region of the dielectric member 13. The first support post 27 is constituted of an electrical insulator. The first support post 27 is supported by the metal cover 25. The first support post 27 supports the first coil 17. The first support post 27 supports a conductive member 26 connected to the second ends 17c of the first coil 17 via a fixing member 28. The conductive member 26 is electrically connected to the metal cover 25 above the first coil 17. The conductive member 26 does not extend into a region above the second coil 18.

The second support post 29 is installed above the peripheral region of the dielectric member 13. The second support post 29 is constituted of an electrical insulator. The second support post 29 is supported by the metal cover 25. The second support post 29 supports the second coil 18.

The first heater 31 and the second heater 32 are installed above the peripheral region of the dielectric member 13, to apply heat to the dielectric member 13 during plasma processing. The first heater 31 is disposed closer to the center than the second heater 32.

The first pressing part 33 and the second pressing part 34 press the first heater 31 and the second heater 32 against the dielectric member 13. The first pressing part 33 is disposed between the first support post 27 and the first heater 31. The first pressing part 33 has a first spring 33a for pressing the first heater 31 against the dielectric member 13. The second pressing part 34 is disposed between the metal cover 25 and the second heater 32. The second pressing part 34 has a second spring 34a for pressing the second heater 32 against the dielectric member 13.

The high-frequency power source 19 supplies a high-frequency power (e.g., AC power of 3 to 30 MHz) to the plasma generation unit 16. The high-frequency power source 19 is connected to the first ends 17b of the first coil 17 and the third ends 18b of the second coil 18, via the matcher 21 and the distributor 22.

The matcher 21 is connected to the high-frequency power source 19. The matcher 21 has a third variable capacitor 21a connected in series with the high-frequency power source 19 and a fourth variable capacitor 21b connected in parallel with the high-frequency power source 19. The matcher 21 is configured to adjust the capacitance value of each of the third variable capacitor 21a and the fourth variable capacitor 21b, so that the impedance (input impedance) of the high-frequency power source 19 matches the impedance (load impedance) at downstream of the matcher 21.

The distributor 22 is connected between the matcher 21 and the plasma generation unit 16. The distributor 22 includes a first distributing circuit 23 for distributing part of the high-frequency power outputted from the high-frequency power source 19 to the first coil 17, and a second distributing circuit 24 for distributing part of the above high-frequency power to the second coil 18. The first distributing circuit 23 has a first variable capacitor 23a and an inductor 23b connected in parallel with each other, and a capacitor 23c connected to the both on their downstream side. The second distributing circuit 24 comprises only a second variable capacitor 24a. The first distributing circuit 23 and the second distributing circuit 24 are connected in parallel with each other.

Here, when there is a great difference between the impedances of the first coil 17 and the second coil 18, the circuit configurations of the matcher 21 and the distributor 22 are complicated. In contrast, in the plasma processing apparatus 10 of the present embodiment, in which the difference between the impedances of the both coils 17 and 18 is small, the matcher 21 and the distributor 22 can be configured simply as described above.

Although preferred embodiments of the present disclosure have been described, the scope of the disclosure should not be limited by this description. For example, matters recited in two or more claims selected from a plurality of claims in the appended claims may be combined as long as no technical contradiction arises.

The present disclosure is applicable to a plasma processing apparatus.

REFERENCE NUMERALS

- 10: plasma processing apparatus
  - 11: chamber
    - 11a: opening
    - 11b: exhaust port
  - 12: stage
    - 12a: placement surface
  - 13: dielectric member
  - 14: cover
    - 14a: first gas hole
    - 14b: second gas hole
  - 15: gas introduction path
    - 15a: first gas introduction path
    - 15b: second gas introduction path
  - 16: plasma generation unit
    - 17: first coil
      - 17a: first conductor
      - 17b: first end
      - 17c: second end
    - 18: second coil
      - 18a: second conductor
      - 18b: third end
      - 18c: fourth end
  - 19: high-frequency power source
  - 21: matcher
    - 21a: third variable capacitor
    - 21b: fourth variable capacitor
  - 22: distributor
    - 23: first distributing circuit
      - 23a: first variable capacitor
      - 23b: inductor
      - 23c: capacitor
    - 24: second distributing circuit
      - 24a: second variable capacitor
  - 25: metal cover
  - 26: conductive member
  - 27: first support post
  - 28: fixing member
  - 29: second support post
  - 31: first heater
  - 32: second heater
  - 33: first pressing part
    - 33a: first spring
  - 34: second pressing part
    - 34a: second spring

What is claimed is:

1. A plasma processing apparatus, comprising:
   a chamber having an opening;
   a stage disposed in the chamber, the stage for placing an object to be processed;
   a dielectric member closing the opening; and
   a plasma generation unit disposed on an opposite side to the chamber with reference to the dielectric member, and configured to, when applied with a high-frequency power, generate a plasma in the chamber, wherein
   the plasma generation unit has a first coil including one or a plurality of first conductors connected in parallel with each other, and a second coil disposed so as to surround the first coil and including a plurality of second conductors connected in parallel with each other, and
   the number of the second conductors included in the second coil is greater than the number of the first conductors included in the first coil.

2. The plasma processing apparatus according to claim 1, further comprising:
   a high-frequency power source configured to supply the high-frequency power;
   a matcher connected to the high-frequency power source; and
   a distributor connected between the matcher and the plasma generation unit, wherein
   the distributor has a first distributing circuit configured to distribute part of the high-frequency power to the first coil, and a second distributing circuit configured to distribute part of the high-frequency power to the second coil, and
   the first distributing circuit and the second distributing circuit are connected in parallel with each other.

3. The plasma processing apparatus according to claim 2, wherein
   the first distributing circuit has a first variable capacitor and an inductor connected in parallel with each other, and
   the second distributing circuit comprises only a second variable capacitor.

4. The plasma processing apparatus according to claim 3, wherein the first distributing circuit further has a capacitor connected in series with the first variable capacitor and the inductor.

* * * * *